United States Patent [19]

Bottman

[11] Patent Number: 4,939,483
[45] Date of Patent: Jul. 3, 1990

[54] MODULATION FREQUENCY RESPONSE STABILIZED AMPLITUDE MODULATION CIRCUIT

[75] Inventor: Jeffrey S. Bottman, Seattle, Wash.

[73] Assignee: John Fluke Mfg. Co., Inc., Everett, Wash.

[21] Appl. No.: 430,318

[22] Filed: Oct. 31, 1989

[51] Int. Cl.$^5$ ............................................... H03C 1/06
[52] U.S. Cl. ...................................... 332/162; 455/126
[58] Field of Search ................ 332/162, 183; 328/168; 455/108, 126

[56] References Cited

U.S. PATENT DOCUMENTS 3,662,290 5/1972 Elliott .................................. 332/162

Primary Examiner—Robert J. Pascal
Attorney, Agent, or Firm—George T. Noe; Richard A. Koske; John P. Dellett

[57] ABSTRACT

A frequency response stabilized amplitude modulation circuit includes a variable gain amplitude modulator producing an output signal having an amplitude proportional to a product of amplitudes of input carrier, modulating and gain control signals. An envelope detector generates a signal having an amplitude responsive to the modulation envelope of the output signal. A first difference amplifier produces the modulating signal input to the amplitude modulator in proportion to a difference between amplitudes of the envelope detection signal and an audio input signal. The modulating signal incorporates negative feedback to ensure the envelope amplitude of the modulated output signal tracks the audio input. A second difference amplifier provides the gain control signal input for the amplitude modulator in accordance with a difference between amplitudes of the modulating signal, scaled by a constant factor, and the envelope detection signal. The second difference amplifier minimizes influence of carrier signal frequency on modulation frequency response by accordingly adjusting the gain of the modulation circuit.

9 Claims, 3 Drawing Sheets

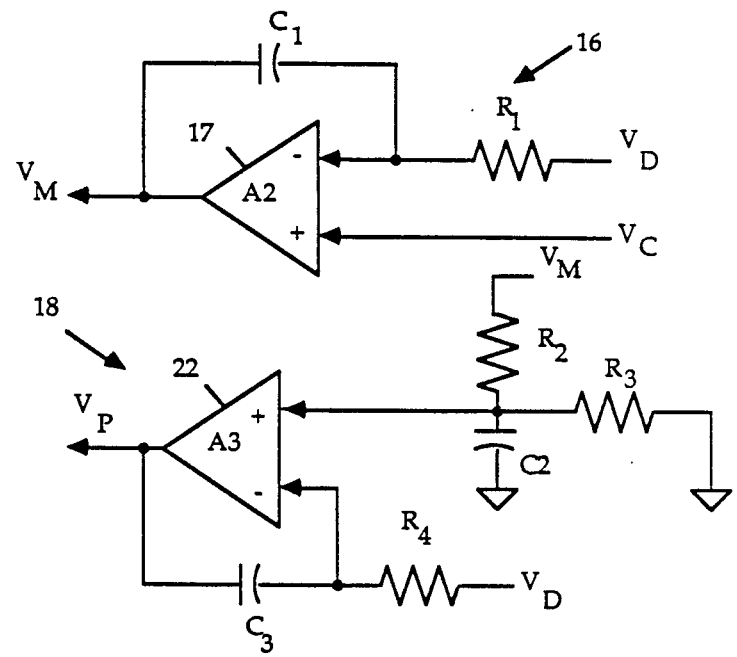
FIG. 5 (PRIOR ART)
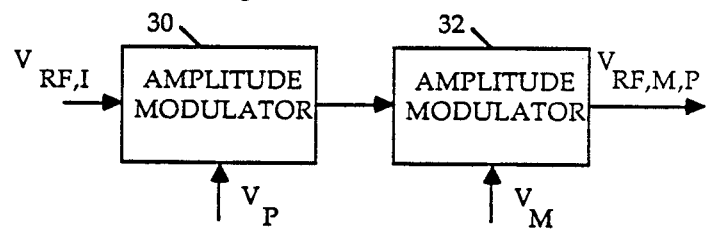
FIG. 6
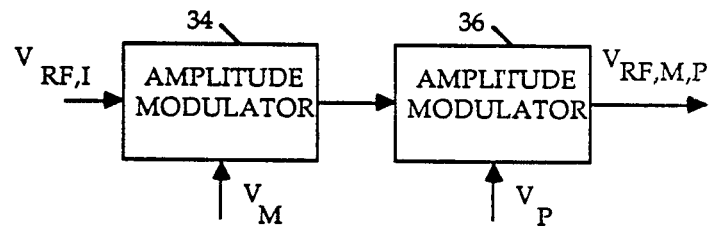
FIG. 7A
FIG. 7B
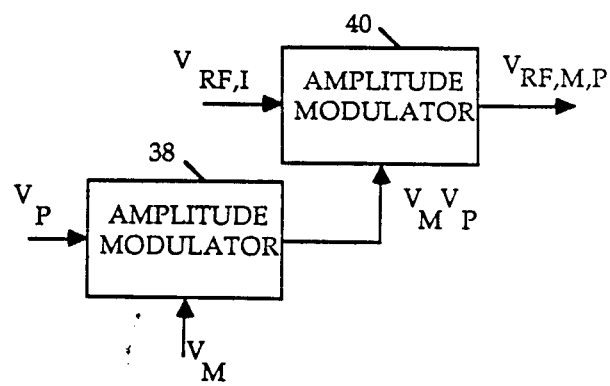
FIG. 7C

MODULATION FREQUENCY RESPONSE STABILIZED AMPLITUDE MODULATION CIRCUIT

BACKGROUND OF THE INVENTION

The present invention relates in general to amplitude modulation circuits and in particular to use of feedback to stabilize modulation frequency response of an amplitude modulation circuit.

The carrier output of a radio frequency (RF) signal generator can be modulated with an audio frequency signal, thereby to produce an amplitude modulated RF output signal. A circuit for effecting this result advantageously employs a leveling loop including a feedback circuit generating a modulating signal proportional to the difference between amplitudes of the audio frequency input and the detected envelope of the RF output signal. In such case, the amplitude of the modulating signal controls the amplitude of the RF output signal, with the leveling loop stabilizing the RF output so that the output envelope tracks the audio input. However, the response of the circuitry including the leveling loop can change with the RF carrier frequency, particularly at higher modulation frequencies. Since users normally desire the RF output signal response to remain constant despite changes in carrier frequency, the above interdependence is undesirable, particularly with respect to test instruments and signal generators.

SUMMARY OF THE INVENTION

The present invention relates to an amplitude modulation circuit having a stable modulation frequency response. The circuit includes a variable gain amplitude modulator, two difference amplifiers, a signal divider, and an envelope detector. The modulator produces an output signal having an amplitude proportional to the product of amplitudes of input carrier, modulation and gain control signals. The envelope detector generates a signal proportional to the amplitude of the modulation envelope of the modulated output signal while a first difference amplifier provides the modulating input having a signal amplitude proportional to the difference between amplitudes of the envelope detection signal and the audio input signal. Feedback from the first difference amplifier is intended to ensure that the envelope amplitude of the output signal remains proportional to the amplitude of the input audio signal, despite changes in input carrier signal amplitude, by appropriately controlling the modulator such that the envelope detection signal level tracks the input modulation. A second difference amplifier monitors amplitudes of the output of the first difference amplifier and the envelope detection signal and generates a further gain control signal input. The amplitude of this gain control signal is proportional to the difference between amplitude levels of the modulating signal and the envelope detection signal. The second difference amplifier minimizes the change in modulation frequency response, due to changes in carrier frequency, by appropriately adjusting the gain of the modulator.

It is accordingly an object of the invention to provide an improved circuit that modulates a carrier signal with a modulating input signal to produce an amplitude modulated output, wherein the frequency response of the circuit is substantially independent of input carrier signal frequency.

The concluding portion of this specification particularly points out and distinctly claims the subject matter of the present invention. However, those skilled in the art will best understand both the organization and method of operation of the invention, together with further advantages and objects thereof, by reading the following description taken in view of the accompanying drawings wherein like reference characters refer to like elements.

BRIEF DESCRIPTION OF THE DRAWINGS

FIG. 5 is a block diagram illustrating in more detail the difference amplifier of FIG. 2;

FIG. 6 is a block diagram illustrating in more detail the second difference amplifier of FIG. 4; and FIGS. 7A–7C are block diagrams illustrating in more detail alternative embodiments of the variable gain amplitude modulator of FIG. 4.

DESCRIPTION OF THE PREFERRED EMBODIMENT

Figure 1:
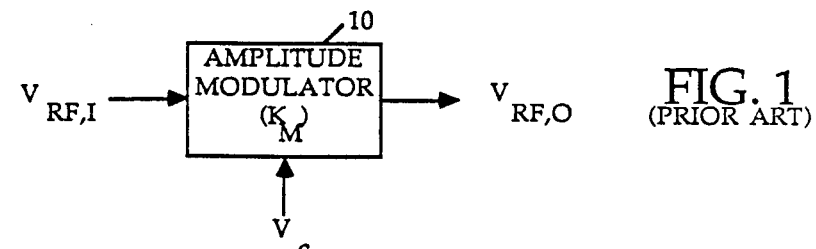
FIG. 1 is a block diagram of a prior art amplitude modulation circuit.

The present invention relates to an amplitude modulation circuit comprising an improvement with respect to prior art modulation circuitry having a leveling loop for causing the output signal to follow the modulation. Referring to FIG. 1, radio frequency amplitude modulator 10 processes an input radio frequency carrier signal $V_{RF,I}$ and an input audio frequency modulation signal $V_C$ to produce an output signal $$V_{RF,O} = K_M V_{RF,I} C_C.$$

where $K_M$ is the gain of the modulator.

Figure 2:
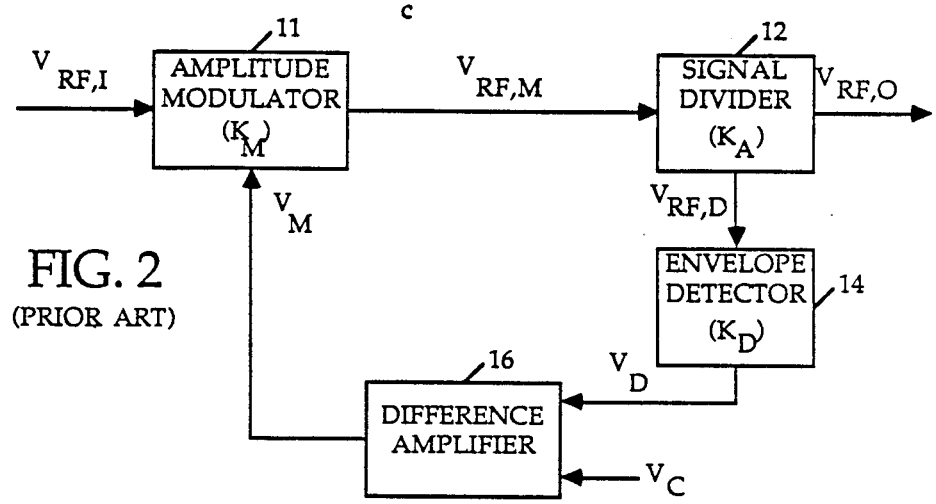
FIG. 2 is a block diagram of a prior art modulation circuit employing a leveling loop.

It is desirable that the amplitude of the output signal $V_{RF,O}$ accurately represent the modulating input. FIG. 2 illustrates in block diagram form a prior art radio frequency level control circuit employing a leveling loop to provide a modulated radio frequency output signal $V_{RF,O}$ that tracks the modulating input, $V_C$. The circuit includes an amplitude modulator 11 producing an output signal $$V_{RF,M} = K_M V_{RF,I} V_m$$

where $K_M$ is the gain of modulator 11, $V_{RF,I}$ is the carrier signal input, and $V_M$ is a modulating signal input. Signal divider 12 splits the $V_{RF,M}$ signal to provide the modulated output signal $V_{RF,O}$ for this signal generator, along with an indicating signal $V_{RF,D}$ proportional to $V_{RF,O}$. An envelope detector 14 produces an output signal VD proportional to the modulation envelope of $V_{RF,D}$. The envelope detection signal VD and an externally supplied audio frequency modulating input signal $V_C$ are applied as inputs to difference amplifier 16, the latter supplying the modulating signal $V_M$ input to amplitude modulator 11.

FIG. 5 illustrates a suitable prior art difference amplifier 16 in more detail. Envelope detection signal $V_D$ is applied through a resistor $R_1$ to an inverting input of an operational amplifier 17 while the modulating audio input signal $V_C$ is applied to a noninverting input of amplifier 17. An integrating capacitor $C_1$ couples the inverting input of amplifier 17 to its output. Modulating signal $V_M$, produced at the output of amplifier 17, is proportional to $V_C - V_D$.

Referring again to FIG. 2, when the circuit output signal $V_{RF,O}$ falls below a desired level as dictated by $V_C$, $V_{RF,D}$ falls proportionately. Detector 14 accordingly lowers the amplitude of envelope detection signal $V_D$ below the amplitude of signal $V_C$. Difference amplifier 16 responds by increasing the amplitude of modulating signal $V_M$, thereby causing modulator 11 to increase the amplitude of its output signal $V_{RF,M}$. Signal divider 12 in turn drives the amplitude of output signal $V_{RF,O}$ back toward the desired level. Conversely, when output signal $V_{RF,O}$ rises above the desired level, the amplitude of output $V_D$ of envelope detector 14 rises above the amplitude of signal $V_C$. Difference amplifier 16 thereupon decreases the amplitude of modulating signal $V_M$, thereby causing modulator 11 to decrease the amplitude of its output signal $V_{RF,M}$.

Thus, the feedback provided by detector 14 and amplifier 16 tends to hold the amplitude of $V_{RF,O}$ at a level determined by modulating input signal $V_C$. That level should be largely independent of the amplitude of the input carrier signal $V_{RF,I}$ since feedback adjustments to the level of $V_M$ make up for variations in amplitude of $V_{RF,I}$. Since amplifier 16 forces $V_D$ to track $V_C$, the amplitude modulation frequency of output signal $V_{RF,O}$ follows the frequency of modulating input signal $V_C$.

A user may change the carrier frequency $w_{RF}$ of the output signal $V_{RF,O}$ by adjusting the frequency of the input carrier signal $V_{RF,I}$. However, as indicated hereinbelow, the carrier signal frequency $w_{RF}$ influences the audio frequency response of the circuit including the level control loop of FIG. 2. Therefore, after adjusting carrier frequency, the user may have to readjust the level of input $V_C$ or of $V_{RF,I}$ to reduce or increase the amplitude modulation depth of output signal $V_{RF,O}$ to its previous value.

Referring to FIG. 2, the amplitude of the signal divider 12 output signal $V_{RF,D}$ is proportional to the product of the amplitudes of the carrier input signal $V_{RF,I}$ and the modulating signal $V_M$:

$$V_{RF,D} = K_A K_M V_M V_{RF,I} \quad [1]$$

where $K_M$ is the gain of modulator 11, and $K_A = V_{RF,D}/V_{RF,M}$ is the gain of signal divider 12. Let $$V_{RF,I} = \bar{V}_{RF,I} \sin(w_{RF} t)$$

where $V_{RF,I}$ is the amplitude of input carrier signal $V_{RF,I}$ and $w_{RF}$ is the frequency of $V_{RF,I}$. (In this case the amplitude of a periodic signal $V_x$ will be designated $\bar{V}_x$.) Also let $$V_M = \bar{V}_M \sin(w_C t)$$

wherein $\bar{V}_M$ is an amplitude component of $V_M$ and $w_C$ is the frequency of modulating signal. Then by substitution into equation [1]:

$$V_{RF,D} = K_A K_M \bar{V}_M \bar{V}_{RF,I} \sin(w_{RF} t) \sin(w_C t) \quad [2]$$

The envelope detector 14 filters radio frequency oscillations from $V_{RF,D}$ so the detector output signal is:

$$V_D = K_D K_A K_M \bar{V}_M \bar{V}_{RF,I} \sin(w_C t) \quad [3]$$

with $K_D$ being the gain of detector 14. The transfer function relating the modulating signal $V_M$ input of modulator 11 to the detector 14 output is obtained by dividing equation [3] by $$V_M = \bar{V}_M \sin(w_C t).$$

Thus $$V_D/V_M = K_D K_A K_M \bar{V}_{RF,I} \quad [4]$$

Due to the nonuniform frequency response of devices 11, 12 and 14, gains $K_M$, $K_D$, and $K_A$ are not constant but change with the frequency $w_{RF}$ of the input carrier signal $V_{RF,I}$.

Referring to FIGS. 2 and 5, the transfer function relating the envelope detection signal $V_D$ to input signal $V_C$ is $$V_D/V_C(w_C) = \frac{jw_C R_1 C_1 + 1}{jw_C(R_1 C_1/\alpha \bar{V}_{RF,I}) + 1} \quad [5]$$

wherein $$\alpha = K_D K_A K_M.$$

Note that since each component $K_D$, $K_A$, and $K_M$ of $\alpha$ is a function of carrier frequency $w_{RF}$, the pole frequency $$w_p = \alpha \bar{V}_{RF,I} R_1 C_1$$

varies with carrier frequency.

Figure 3:
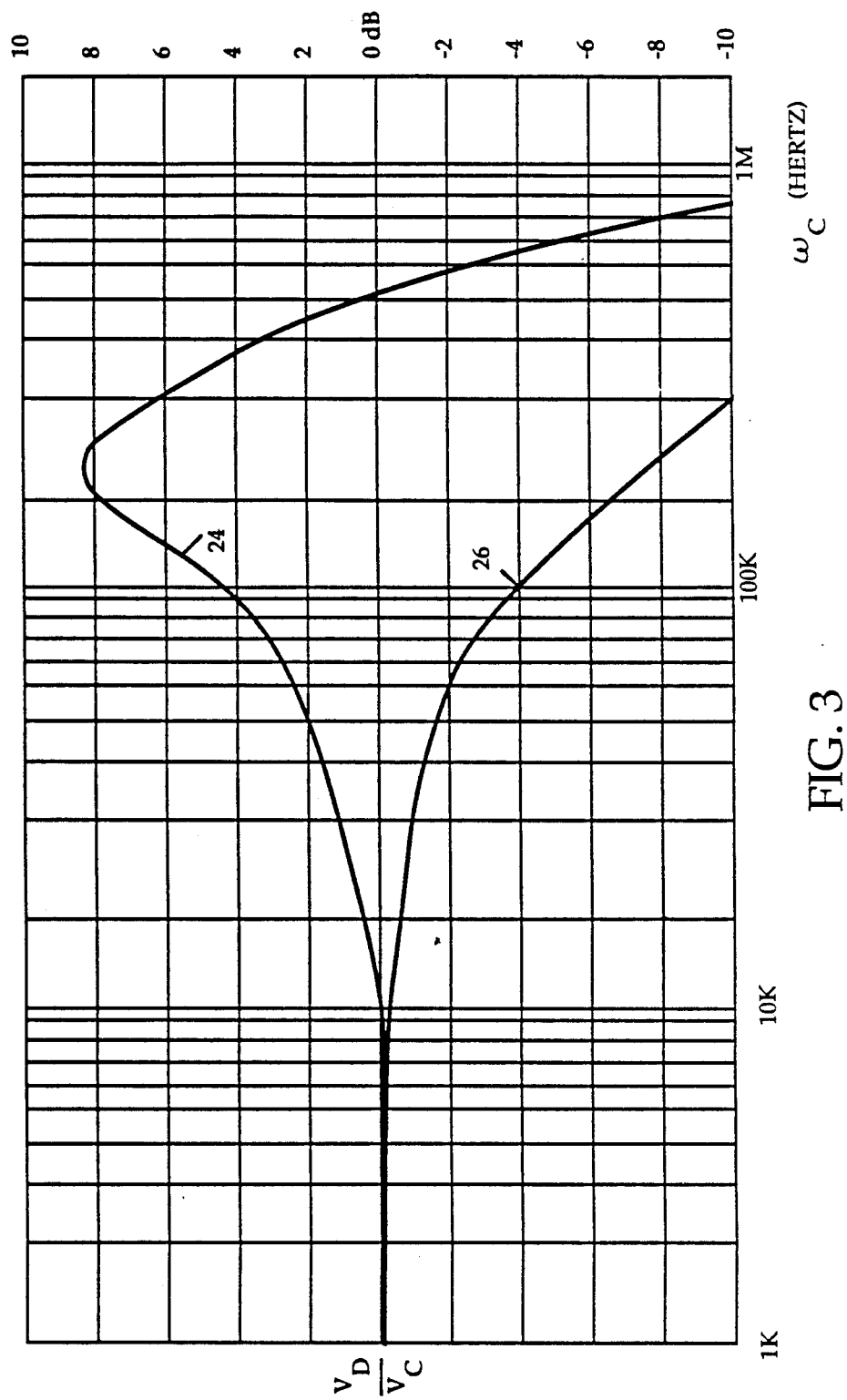
FIG. 3 is a plot of modulation frequency response of the circuit of FIG. 2 for two carrier frequencies.

Plots 24 and 26 of FIG. 3 illustrate typical frequency response of the circuit of FIG. 2 per equation [5] for two different carrier frequencies $w_{RF}$. Note that the modulating frequency response varies with carrier frequency. For a given signal $V_C$ of modulating frequency $w_C$ above 10K Hertz, the magnitude of detector signal $V_D$ varies substantially with carrier frequency. Since $V_D$ is proportional to the modulation envelope amplitude of output signal $V_{RF,O}$, it is apparent the output signal modulation depth changes as the user adjusts carrier signal frequency $w_{RF}$ with $w_C$ constant.

Figure 4:
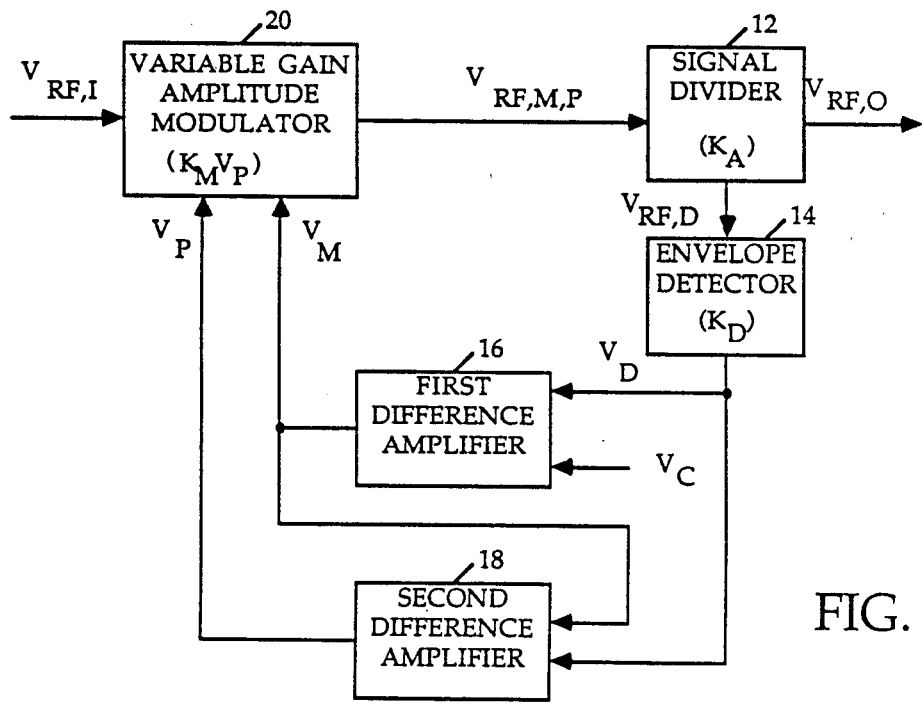
FIG. 4 is a block diagram of a frequency response stabilized amplitude modulation circuit in accordance with the present invention.

As illustrated in FIG. 4, the circuit according to the present invention improves the circuit of FIG. 2 by adding a second difference amplifier 18 and replacing amplitude modulator 11 of FIG. 2 with a variable gain amplitude modulator 20. Modulator 20 produces an output signal $$V_{RF,M,P} = V_{RF,I} V_M V_P K_M \quad [6]$$

where $V_P$ is a gain control input signal and where $V_P K_M$ is the "variable gain" of modulator 20. The circuit of FIG. 4 adjusts the variable gain modulator in such a way that the ratio of the envelope detector voltage $V_D$ and the modulating signal $V_M$ is held substantially constant whereby the modulating frequency response is no longer dependent upon the RF frequency.

FIGS. 7A–7C illustrate in block diagram form alternative embodiments of variable gain amplitude modulator 20, each employing two modulators similar to modulator 10 of FIG. 1. The circuit of FIG. 7A employs an amplitude modulator 30 for modulating $V_{RF,I}$ with $V_P$. Another modulator 32 modulates the output of modulator 30 with $V_M$ to produce $V_{RF,M,P}$. The circuit of FIG. 7B utilizes an amplitude modulator 34 for modulating $V_{RF,I}$ with $V_M$. Another modulator 36 modulates the output of modulator 34 with $V_P$ to produce $V_{RF,M,P}$. The circuit of FIG. 7C comprises an analog multiplier 38 that produces an output that is the product of $V_p$ and $V_M$ and a modulator 40 to modulate $V_{RF,I}$ by the output of multiplier 38. Other circuits capable of carrying out the function of variable gain amplitude modulator 20 in FIG. 4 will be readily appreciated by those skilled in the art.

Second difference amplifier 18 in FIG. 4, illustrated in detail in FIG. 6, generates the gain control input $V_P$. Referring to FIG. 6, amplifier 18 comprises an operational amplifier 22 having a noninverting input coupled to $V_M$ through a resistor $R_2$, and returned to ground through resistor $R_3$ and a parallel integrating capacitor $C_2$. An inverting input of operational amplifier 22 is tied to $V_D$ through a resistor $R_4$ as well as to the amplifier output through capacitor $C_3$. Gain control signal $V_P$, generated at the output of amplifier 22, is proportional to the difference between $V_D$ and $\beta V_M$, where $\beta$ depends on $R_2$ and $R_3$. The outer loop comprising amplifier 18 suitably has a slower bandwidth than the inner loop including amplifier 16, so that as far as the outer loop is concerned, the action of the inner loop is substantially instantaneous in equating $V_C$ and $V_D$. The outer loop maintains a constant ratio of $V_M$ to $V_D$, with $V_D$ equaling $V_C$.

Referring to FIG. 4, the second difference amplifier 18 provides negative feedback increasing the gain level of modulator 20 as the ratio of $V_D$ to $V_M$ falls, and decreasing the gain level of modulator 20 as the ratio of $V_D$ to $V_M$ rises. The transfer function relating $V_D$ to $V_M$ is $$V_D/V_M = K_D K_A K_M V_P V_{RF,I} \quad [7]$$

or $$V_D/V_M = \alpha \overline{V}_{RF,I} \quad [8]$$

where $$\alpha = K_D K_A K_M V_P.$$

Since amplifier 18 maintains a constant ratio of $V_D$ to $V_M$, both sides of equation [8] are constant despite changes in carrier signal frequency. In other words, the $V_P$ signal produced by difference amplifier 18 adjusts the gain $V_p K_M$ of modulator 20 so that the right hand side of equation [8] remains independent of carrier signal frequency.

Referring to FIGS. 2 and 5, and equation [5] above, the transfer function relating the envelope detection signal $V_D$ to input signal $V_C$ is $$V_D/V_C(w_C) = \frac{jw_C R_1 C_1 + 1}{jw_C(R_1 C_1/\alpha V_{RF,I}) + 1} \quad [9]$$

Since
$\alpha V_{RF,I} = K$ (a constant),
by substitution into equation [9]

$$V_D/V_C(w_C) = \frac{(jw_C R_1 C_1 + 1)}{jw_C(R_1 C_1/K) + 1} \quad [10]$$

As can be seen from equation [10], the modulating frequency response $V_D/V_C(w_C)$ of the circuit of FIG. 4 is independent of carrier frequency. Therefore, when the frequency of input carrier signal $V_{RF,I}$ changes, the carrier frequency of the output signal $V_{RF,O}$ changes. However, the amplitude modulation depth of the output signal does not change with RF frequency.

As will be understood by those skilled in the art, since the feedback provided by the first difference amplifier 16 of FIG. 4 causes $V_D$ to closely follow $V_C$, an alternative embodiment of the present invention employs $V_C$ as an input to second difference amplifier 18 instead of $V_D$.

Thus, the amplitude modulation circuit of the present invention produces a modulated output signal $V_{RF,O}$ having a carrier frequency $w_{RF}$ determined by the frequency of an input carrier signal and having an output signal amplitude $\overline{V}_{RF,O}$ and modulation frequency $w_C$ determined by the amplitude and frequency of an input signal $V_C$.

While the foregoing specification has described a preferred embodiment of the present invention, it will be appreciated that many modifications may be made without departing from the invention in its broader aspects. The appended claims are therefore intended to cover all such changes and modifications as fall within the true spirit and scope of the invention.

I claim:

1. A modulation frequency response stabilized amplitude modulation circuit comprising:
   first means for generating an output signal of amplitude varying with a product of amplitudes of a radio frequency input carrier, gain control and modulating signals; and
   second means responsive to the output signal and an audio input signal for providing the modulating and gain control signal inputs to said first means, the modulating signal having an amplitude varying with a difference between amplitudes of the input signal and the modulation envelope of the output signal, and the gain control signal having an amplitude varying in response to the relative amplitudes of said modulating signal and the modulation envelope.

2. The amplitude modulation circuit in accordance with claim 1 wherein said second means comprises:
   envelope detection means for generating an envelope detection signal having an amplitude varying with the modulation envelope of the output signal;
   first difference amplifier means responsive to the input and envelope detection signals and providing the modulating signal to said first means, the modulating signal having an amplitude varying with a difference between amplitudes of the input signal and the envelope detection signal; and
   second difference amplifier means responsive to the modulating and envelope detection signals and providing the gain control signal input to said first means, the gain control signal having an amplitude varying in proportion to a difference between amplitudes of a function of the modulating signal and the envelope detection signal.

3. A modulation frequency response stabilized amplitude modulation circuit comprising:
   first means for generating an output signal of amplitude varying with a product of amplitudes of input carrier, gain control and modulating signals; and
   second means responsive to the output signal and an input signal for providing the modulating and gain control signal inputs to said first means, the modulating signal having an amplitude varying with a difference between amplitudes of the input signal and the modulation envelope of the output signal, and the gain control signal having an amplitude varying in proportion to the difference between amplitudes of a function of the modulating signal and the input signal.

4. The amplitude modulation circuit in accordance with claim 3 wherein said second means comprises:

envelope detection means for generating an envelope detection signal having an amplitude varying with the modulation envelope of the output signal;

first difference amplifier means responsive to the input and envelope detection signals, and providing the input modulating signal to said first means, the modulating signal having an amplitude varying with a difference between amplitudes of the input signal and the envelope detection signal; and second difference amplifier means responsive to the modulating and input signals and providing the gain control signal input to said circuit means, the gain control signal having an amplitude varying in proportion to the difference between amplitudes of a function of the modulating signal and the input signal.

5. A modulation frequency response stabilized amplitude modulation circuit comprising:

circuit means for generating an output signal of amplitude varying with a product of amplitudes of input carrier, gain control and modulating signals and for generating an envelope detection signal having an amplitude varying with a modulation envelope of the output signal;

a first feedback circuit providing the input modulating signal to said circuit means, the modulating signal having an amplitude varying with a difference between amplitudes of an input signal and the envelope detection signal; and a second feedback circuit providing the gain control signal input to said circuit means, the gain control signal having an amplitude varying in proportion to a difference between amplitudes of a function of the modulating signal and one of the envelope detection signal and the input signal.

6. The amplitude modulation circuit in accordance with claim 5 wherein said circuit means comprises:

variable gain modulation means for producing the output signal of amplitude varying with a product of amplitudes of the input carrier, gain and modulating signals; and envelope detection means responsive to the output signal for generating the envelope detection signal having an amplitude varying with the modulation envelope of the output signal.

7. The amplitude modulation circuit in accordance with claim 5 wherein said circuit means comprises:

variable gain modulation means for producing a first signal of amplitude-varying with a product of amplitudes of the input carrier, gain and modulating signals;

signal splitting means responsive to the first signal for producing said output signal and an indicating signal, said indicating and said output signals varying with said first signal, and envelope detection means responsive to the indicating signal for generating an envelope detection signal having an amplitude varying with a modulation envelope of said indicating signal.

8. For a variable gain amplitude modulator circuit generating an output signal of amplitude varying with a product of amplitudes of input carrier, gain control and modulating signals, a method for stabilizing modulation signal frequency response of the circuit with respect to changes in carrier signal frequency, comprising the steps of:

continuously adjusting the modulating signal input to said modulator circuit such that its output amplitude varies with a difference between amplitudes of an input signal and a modulation envelope of the output signal, and continuously adjusting the gain control signal input to said modulator circuit such that its output amplitude varies in proportion to a difference between amplitudes of a function of the modulating signal and the modulation envelope.

9. For a variable gain amplitude modulator circuit generating an output signal of amplitude varying with a product of amplitudes of input carrier, gain control and modulating signals, a method for stabilizing modulation signal frequency response of the circuit with respect to changes in carrier signal frequency, comprising the steps of:

continuously adjusting the modulating signal input to said modulator circuit such that its output amplitude varies with a difference between amplitudes of an input signal and a modulation envelope of the output signal, and continuously adjusting the gain control signal input to said modulator circuit such that its output amplitude varies in proportion to a difference between amplitudes of a function of the modulating signal and said input signal.

* * * * *